(12) United States Patent
Kerdiles

(10) Patent No.: US 7,419,884 B2
(45) Date of Patent: Sep. 2, 2008

(54) METHOD OF BONDING TWO WAFERS OF SEMICONDUCTOR MATERIALS

(75) Inventor: Sébastien Kerdiles, Saint-Ismier (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 405 days.

(21) Appl. No.: 11/285,009

(22) Filed: Nov. 23, 2005

(65) Prior Publication Data

US 2006/0240642 A1 Oct. 26, 2006

(30) Foreign Application Priority Data

Apr. 22, 2005 (FR) .................................. 05 04093

(51) Int. Cl.
 *H01L 21/30* (2006.01)
(52) U.S. Cl. ............................... 438/455; 257/E21.567
(58) Field of Classification Search ................. 438/455; 257/E21.567
 See application file for complete search history.

(56) References Cited

U.S. PATENT DOCUMENTS

| 6,180,496 B1 | 1/2001 | Farrens et al. ............... 438/455 |
| 6,563,133 B1 * | 5/2003 | Tong ............................. 257/52 |
| 7,078,317 B2 * | 7/2006 | Henley ........................ 438/455 |
| 2003/0003684 A1 | 1/2003 | Farrens et al. ............... 438/455 |
| 2005/0070073 A1 | 3/2005 | Al-Bayati et al. ........... 438/460 |

FOREIGN PATENT DOCUMENTS

WO WO 2006/020439 A2 2/2006

OTHER PUBLICATIONS

D. Pasquariello et al., "Surface Energy As A Function Of Self-Bias Voltage In Oxygen Plasma Wafer Bonding", Sensors and Actuators, vol. 82, pp. 239-244 (2000).
J.P. Colinge, "Silicon-On-Insulator Technology: Materials to VLSI, Second Edition," Kluwer Academic Publishers, pp. 50-51.
T. Suni et al., "Effects of Plasma Activation on Hydrophilic Bonding of Si and $SiO_2$," Journal of the Electrochemical Society, 149 (6) G348-G351 (2002).

* cited by examiner

*Primary Examiner*—Asok K Sarkar
(74) *Attorney, Agent, or Firm*—Winston & Strawn LLP

(57) ABSTRACT

The invention relates to a method of bonding together two wafers made of materials selected from semiconductor materials by providing two wafers each having a surface that is suitable for molecular bonding; and conducting plasma activation of at least one surface of one of the wafers by directing plasma species onto the surface(s) being activated while controlling activation parameters of the plasma to provide kinetic energy to the species sufficient to create a disturbed region of controlled thickness beneath the surface(s) being activated. Advantageously, the surface of each wafer is activated for optimum results while the controlling of the activation parameters also serves to control the maximum depth of the disturbed region in the surfaces. During plasma activation, the activation parameters are controlled to modify the kinetic energy of the species contained in the plasma in order to create one or a plurality of disturbed regions of controlled thickness in the thickness of a surface region of the wafer(s) whose surface is being activated.

26 Claims, 2 Drawing Sheets

METHOD OF BONDING TWO WAFERS OF SEMICONDUCTOR MATERIALS

BACKGROUND OF THE INVENTION

The present invention relates to a method of bonding two wafers made out of materials selected from semiconductor materials, the method making use of plasma activation of the surface of at least one of the two layers that are to be bonded together.

Methods of this type are generally known. The term "bonding" is used herein to mean bonding by molecular bonding during which two perfectly plane surfaces are bonded together without applying any adhesive—and this being possible at ambient temperature. The quality of the bond is characterized in particular by its bonding energy, which represents the connection force between the two bonded-together wafers.

In order to consolidate bonding by molecular bonding between two wafers, the bonded-together wafers are subjected to heat treatment. Such heat treatment enables the bonding energy of the two wafers to be raised to a value of at least about 500 millijoules per square meter ($mJ/m^2$), where this corresponds to the values that are typically desired. In conventional manner, such heat treatment is generally carried out at a temperature of at least about 900° C. (which in the context of the present specification defines the "high temperature" domain). When bonding between a wafer made of Si and a wafer made of Si or of $SiO_2$, the bonding energy is maximized when heat treatment is carried out at temperatures of the order of 1100° C. to 1200° C.

"Plasma activation" of a surface for bonding is defined as exposing a surface to a plasma (which can be carried out in particular under a vacuum or at atmospheric pressure) prior to putting the surfaces for bonding together into contact. More precisely, in prior art activation techniques, the surface of a wafer for activation is exposed to a plasma during an exposure step in which the exposure parameters are controlled so that each is set at a given respective value, which values remain unchanged during plasma activation.

First order "exposure parameters" are as follows:

power density; this is the density of the power feeding the plasma, which represents a power density per unit area in watts per square centimeter ($W/cm^2$), and is sometimes also referred to in the present specification by the term "power", for simplicity;

pressure (pressure in the enclosure containing the plasma); and the nature and the flow rate of the gas fed into the enclosure. Such activation serves in particular to perform bonding by molecular bonding, obtaining high bonding energies without requiring any recourse to heat treatment that would necessarily need to be carried out at high temperatures.

Plasma activation thus makes it possible to obtain high bonding energies between two wafers, at least one of which is activated prior to bonding, and after applying heat treatment over relatively short durations (e.g. about 2 hours (h)), and at temperatures that are relatively low (e.g. about 600° C., or less). Such activation is thus advantageous for stabilizing a structure comprising two bonded-together wafers, when it is desired to avoid subjecting the structure to temperatures that are too high (as applies in particular to heterostructures, defined as being structures comprising layers made of materials having coefficients of thermal expansion that are significantly different). Such activation can also be advantageous for obtaining high bonding forces at a given temperature.

Such activation is thus advantageous for making multilayer structures involving the bonding together of two wafers. Transfer methods (in particular methods of the SMART-CUT® type as described in general terms in the work "Silicon-on-insulator technology: materials to VLSI", 2nd edition (Jean-Pierre Colinge)) constitute one example of an application that can benefit from plasma activation to enhance bonding. The present invention is therefore directed at providing improvements in such methods.

SUMMARY OF THE INVENTION

The present invention relates to a method of bonding together two wafers made of semiconductor materials, which comprises providing two wafers each having a surface that is suitable for molecular bonding; and conducting plasma activation of at least one surface of one of the wafers by directing plasma species onto the surface(s) being activated while controlling activation parameters of the plasma to provide kinetic energy to the species sufficient to create a disturbed region of controlled thickness beneath the surface(s) being activated. Advantageously, the surface of each wafer is activated for optimum results while the controlling of the activation parameters also serves to control the maximum depth of the disturbed region in the surfaces.

The disturbed region generally extends in the thickness of the wafer(s) whose surface is being activated between a depth of 10 Å and a depth of 250 Å. To do this, the kinetic energy provided for the species contained in the plasma is typically at a level of 10 eV to 2 keV.

In this method, the controlling of the activation parameters comprises:

controlling kinetic energy by controlling the power density for generating the plasma wherein the power density is fed to an electrode connected to the wafer surface(s);

controlling the composition of the gas in which the plasma is created to provide a desired kinetic energy; or controlling pressure in the plasma to provide a desired kinetic energy.

The controlling of the activation parameters can be implemented in order to create a single disturbed region in the thickness of the surface region of the wafer(s) whose surface is being activated, or to create a plurality of disturbed regions.

The invention also relates to a method of transferring a thin layer of semiconductor material from a top wafer forming a donor substrate to a base wafer forming a receiver substrate, the method implementing bonding as disclosed herein in order to bond a surface of the donor substrate to a surface of the receiver substrate prior to transferring the thin layer. This method further contemplates implanting atomic species in the top wafer prior to bonding to create a zone of weakness in the donor substrate beneath the thin layer to be transferred, followed by detachment of the thin layer at the zone of weakness after bonding the wafers together.

BRIEF DESCRIPTION OF THE DRAWINGS

Other features and advantages of the invention appear more clearly on reading the following description made with reference to the accompanying drawings, in which.

DETAILED DESCRIPTION OF THE PREFERRED EMBODIMENTS

Figure 1:
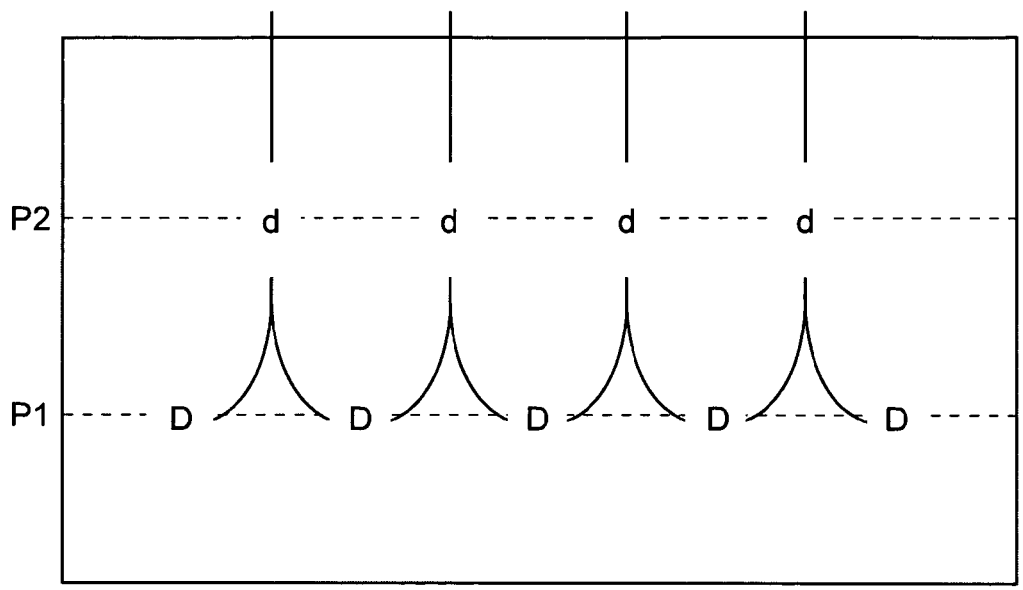
FIG. 1 is a diagram of a distribution of disturbances/disorders that can be obtained in the context of the invention in the thickness of a plasma-activated wafer.

The invention now improves prior art bonding techniques that implement plasma activation, in particular, to increase the bonding energy obtained after plasma activation. This makes it possible to obtain a high level of bonding energy, even when only one of the two surfaces for bonding together has been plasma-activated prior to bonding.

This is accomplished by the present method of bonding together two wafers made of materials selected from semiconductor materials. This method implements plasma activation of the surface of at least one of the two wafers to be bonded together, and comprises, during plasma activation, controlling the activation parameters to modify the kinetic energy of the species contained in the plasma in order to create a disturbed region of controlled thickness in the thickness of a surface region of the wafer whose surface is being activated.

Preferred but non-limiting features of the method of the invention are as follows:

the control of the activation parameters also serves to control the maximum depth of the disturbed region in the wafer whose surface is being activated;

the control of the activation parameters comprises controlled variation of the parameters;

the disturbed region extends in the thickness of the wafer whose surface is being activated between a depth of 10 angstroms (Å) and a depth of 250 Å;

the species are preferably the ions of the plasma;

the control seeks to obtain kinetic energy for the species contained in the plasma at a level lying in the range 10 electron volts (eV) to 2 kilo electron volts (keV);

the control of the activation parameters comprises controlling kinetic energy by controlling the power density fed to an electrode connected to the wafer whose surface is to be activated;

the power density is controlled in such a manner as to achieve controlled variation in the density of the power generating the plasma;

the power density is caused to vary by initially applying a high power, and then subsequently applying a low power that is lower than the high power;

the variation between high power and low power is performed in power steps, one power step corresponding to high power, and another power step corresponding to low power;

the step corresponding to high power and the step corresponding to low power are each carried out for a duration lying in the range of 5 seconds (s) to 60 s and preferably in the range of 10 s to 30 s;

the variation between high power and low power is performed by causing the power to decrease in continuous manner from the high power down to the low power;

the high power has a value lying in the range 1.5 W/cm$^2$ to 15 W/cm$^2$ of the area to be activated, and the low power has a value lying in the range 0.15 W/cm$^2$ to 1.5 W/cm$^2$ of the area to be activated;

the high power has a value of 3 W/cm$^2$ of the area to be activated and the low power has a value of 0.8 W/cm$^2$ of the area to be activated;

the surface of the wafer to be activated is a disk having a diameter of 200 millimeters (mm), the high power has a value of 1000 watts (W), and the low power has a value of 250 W;

the surface of the wafer to be activated is a disk having a diameter of 300 mm, the high power has a value of 2000 W, and the low power has a value of 500 W;

the plasma is generated by equipment of the reactive ion etching (RIE) type having a single radiofrequency (RF) generator feeding the electrode supporting the wafer to be activated via capacitive coupling;

the variation is performed over a time interval of duration lying in the range 10 s to 2 minutes (min);

the electrode connected to the wafer whose surface is to be activated is used solely for controlling the kinetic energy of the plasma species;

the electrode connected to the wafer whose surface is to be activated is used both for controlling the kinetic energy of the plasma species, and for exciting the plasma;

the control of the activation parameters comprises controlling the kinetic energy by controlling the composition of the gas in which the plasma is created;

the control of gas composition is performed to obtain controlled variation in the nature of the gas used for generating the plasma;

the variation consists in treating the surface to be activated with a plasma obtained from a first gas, and subsequently with a plasma obtained from a second gas;

the first gas is made up of one or more species that is/are lighter in weight than the second gas;

the first gas is helium and the second gas is oxygen or argon, or the first gas is oxygen and the second gas is argon;

the first and/or second gas is/are a gas mixture, e.g. a mixture between a species that is to be ionized (Ar or $O_2$, for example) and a species that is to remain neutral (non-ionized), but that serves to dilute and determine the quantity of the ionized species (the non-ionized species may be constituted by helium, for example);

the control of the activation parameters comprises controlling kinetic energy by controlling the pressure in the plasma;

the control of pressure is implemented to obtain controlled variation in pressure;

the controlled variation in pressure consists in controlling the pressure to occupy a "low" level initially during activation, and then subsequently a "high" level that is greater than the low level;

the control of the activation parameters is implemented in order to create a single disturbed region in the thickness of the surface region of the wafer whose surface is being activated;

the control of the activation parameters is implemented in order to create a plurality of disturbed regions in the thickness of the surface region of the wafer whose surface is being activated, each of the disturbed regions extending over a respective depth in the thickness of the wafer; and in order to perform the bonding, the surface of only one of the two wafers that are to be bonded together is subjected to plasma activation.

In another embodiment, the invention provides a method of transferring a thin layer of semiconductor material from a top wafer forming a donor substrate to a base wafer forming a receiver substrate, the method implementing bonding according to any of the above-mentioned aspects and features in order to bond a surface of the donor substrate to a surface of the receiver substrate prior to transferring the thin layer.

Preferred but non-limiting features of this method are as follows:

the transfer method is implemented using the well known SMART-CUT® method by implementing a weakening implantation of atomic species into the top wafer prior to bonding in order to create a zone of weakness in the thickness of the donor substrate, followed by detachment of the thin layer at the zone of weakness after bonding; and after implantation and prior to bonding, the oxidized surface of the donor substrate is preferably subjected to plasma activation.

The invention applies to bonding together two wafers of any semiconductor material. Each of the materials may be Si or some other conventional semiconductor material.

The surfaces for bonding together of the two wafers may also be oxidized prior to activation—and more precisely one or the other of the surfaces for bonding together may be oxidized, or both of them may be oxidized. As explained below, activation can be implemented on both of the surfaces for bonding together, or on only one of them. A preferred advantage of the invention is to be able to activate only one of the two surfaces for bonding together, while nevertheless obtaining sufficiently high bonding energy after they have been bonded together.

It is also specified that the invention makes it possible to obtain bonding in the context of a method of transferring a thin layer of semiconductor material constituting a top wafer forming a donor substrate onto a base wafer forming a receiver substrate. The term "thin layer" is used to mean a layer that is a few tens to a few hundreds of angstroms thick. In this application to transfer methods, bonding is implemented after activation between a surface of the donor substrate and a surface of the receiver substrate.

The transfer method can be implemented in particular using the well known SMART-CUT® method in which weakening implantation is performed prior to bonding so as to create a zone of weakness in the thickness of the donor substrate, with detachment being performed in the zone of weakness after bonding. By way of example, it is specified that prior to bonding, plasma activation can be implemented on the oxidized surface of the donor substrate after it has been implanted.

The invention differs from known methods in which activation is performed in a single step during which the activation parameters are unchanging and do not vary. In the present invention, at least one wafer surface for bonding is subjected to plasma activation while controlling the activation parameters for the purpose of modifying the kinetic energy of the species contained in the plasma so as to create a disturbed region of controlled depth in the thickness of a surface region of the wafer whose surface is being activated. In other words, by controlling the activation parameters, it is possible to obtain a disturbed region in the thickness of each activated surface and that extends into the activated wafer down to a controlled depth as desired.

In addition, controlling the activation parameters also makes it possible to control the thickness of the disturbed region. In practice, it can be desired to constitute a disturbed region that is "buried" in the thickness of the activated wafer, or else a disturbed region that is flush with the surface. In any event, the invention makes it possible to control the thickness and the depth of the disturbed region that is created (i.e. to control its "maximum" depth and its "minimum" depth in the thickness of the activated wafer).

In this respect, it is specified that it is preferable to perform activation in such a manner as to obtain for the species contained in the plasma:

during an initial period of the activation, a maximum level of kinetic energy for the activation; and subsequently, during a second period of the activation, a level of kinetic energy that is lower.

This makes it possible, within the thickness of the wafer being subjected to the activation, to generate:

during the initial period of the activation, disturbances/disorders (D) that are large and that are buried around a depth P1 in the wafer; and during the second period of the activation, disturbances/disorders (d) that are smaller, and that are buried at a depth P2 that is shallower than the depth P1.

This activation control sequence serves to maximize the thickness of the disturbed region, and also to maximize its maximum depth.

It appears that this disturbed region acts as a "reservoir" suitable for receiving the gases and other elements present on the surface that is to be bonded. By attracting and trapping the gases and other elements, the disturbed region thus appears to enhance bonding.

It is thought that the disturbances/disorders D are suitable for being "fed" with gas and other elements for trapping by the disturbances/disorders d that are interposed between the disturbances/disorders D and the surface to be activated—with the disturbances/disorders D and d forming a kind of trapping lattice extending in the depth of the wafer (see FIG. 1 which shows a distribution obtained in the thickness of a plasma-activated wafer).

The term "disturbed region" is used in this specification to mean a region that is modified by being exposed to the plasma, with the modification corresponding to introducing into the disturbed region defects, disturbances, and disorders at atomic scale (weakening of atomic bonds, changing of bond angles, . . . ).

This alteration serves to improve bonding between wafers—and in particular to increase bonding energy. This alteration is characterized by an etching speed that is higher than the etching speed that is observed on a non-activated wafer. Such a "disturbed" region is etched more quickly than a non-activated wafer (for example wet etching of the surface clean No. 1 (SC1) type using $NH_4OH+H_2O_2+H_2O$).

By way of example, for wet etching of the SC1 type $(NH_4OH+H_2O_2+H_2O)$ carried out for three minutes (at constant temperature), the following etching thicknesses are observed for layers of different materials:

non-treated silicon oxide layer (i.e. a substrate having a surface layer of $SiO_2$): 6 Å;

implanted silicon oxide layer (using hydrogen for layer transfer by a method of the SMART-CUT® type): 20 Å; and for a silicon oxide layer that has been "disturbed" in the meaning of the present specification, by using plasma exposure: 37 Å. It is specified that this value of 37 Å is the same regardless of whether or not the layer has been implanted.

These results show that the disturbance created by plasma activation can be characterized by a significantly increased etching speed. The above results were obtained for an etching solution at a temperature of 70° C. (SC1 solution).

It is to be noted that the increase in etching speed observed on a wafer of material that has been "disturbed" in the meaning of the present specification increases with increasing temperature at which etching is performed. The etching speed information provided above in the context of a wafer of material that has been subjected to implantation illustrates the fact that a material that has been "disturbed" in the meaning of the present specification is characterized by an etching speed that is even faster than that observed on a material of the same type that has not been "disturbed", but that has been implanted. Concerning the increase in etching speed observed in a material that has been altered by plasma activation, reference can be made to the article "Effect of plasma activation on hydrophilic bonding of Si and $SiO_2$", J. of Electrochem. Soc., Vol. 149, No. 6, p. 348 (2002) by T. Suni et al.

The disturbed region obtained in the context of the invention typically extends in the thickness of the wafer whose surface has been activated to a depth lying in the range 10 Å to 250 Å. The "species" mentioned above are typically ions of the plasma, and control over the activation parameters typically seeks to obtain kinetic energy for the species contained in the plasma at levels lying in the range 10 eV to 2 keV.

In general, control of the activation parameters preferably comprises a controlled variation of at least some of the parameters. Such control variation makes it possible specifically to obtain a disturbed region that is continuous and uniform (e.g. by varying power, whether stepwise or continuously, with the different values of power serving to constitute the different depths of the disturbed region in the thickness of the wafer that is being activated).

In one embodiment, the control variation of the activation parameters is preferably implemented so as to obtain high kinetic energy for the ions at the beginning of activation and lower kinetic energy towards the end of activation. The invention is implemented in an installation comprising a plasma enclosure in which the pressure and the composition of the atmosphere are controlled. There exist several types of such installation.

The invention can be implemented in an installation of the RIE type comprising a single RF generator feeding an electrode supporting the wafer for activation via capacitive coupling. It is the single RF generator that serves to generate the plasma (i.e. to excite the species). The "power" referred to in this specification and constituting one of the activation parameters is more precisely the power of the generator connected to the electrode in contact with the wafer to be activated. The plasma enclosure has a second electrode that is not connected to the wafer to be activated. This second electrode is not connected to any generator. In this variant, controlling the power of the sole generator (which is connected to the electrode in contact with the wafer to be activated) serves both to excite the plasma and to control the kinetic energy of the plasma ions that bombard the surface of the wafer to be activated.

It is also possible to implement the invention in an installation similar to that described above, but in which the same electrode is connected to a second RF generator. Under such circumstances, it is the second RF generator (connected to the electrode with which the wafer to be activated is not in contact) that excites the plasma. The second generator is thus controlled to control the density of the plasma. In this variant, controlling the power of the first generator (which is connected to the electrode in contact with the wafer to be activated) serves solely to control the kinetic energy of the ions in the plasma that bombards the surface of the wafer to be activated.

Figure 2:
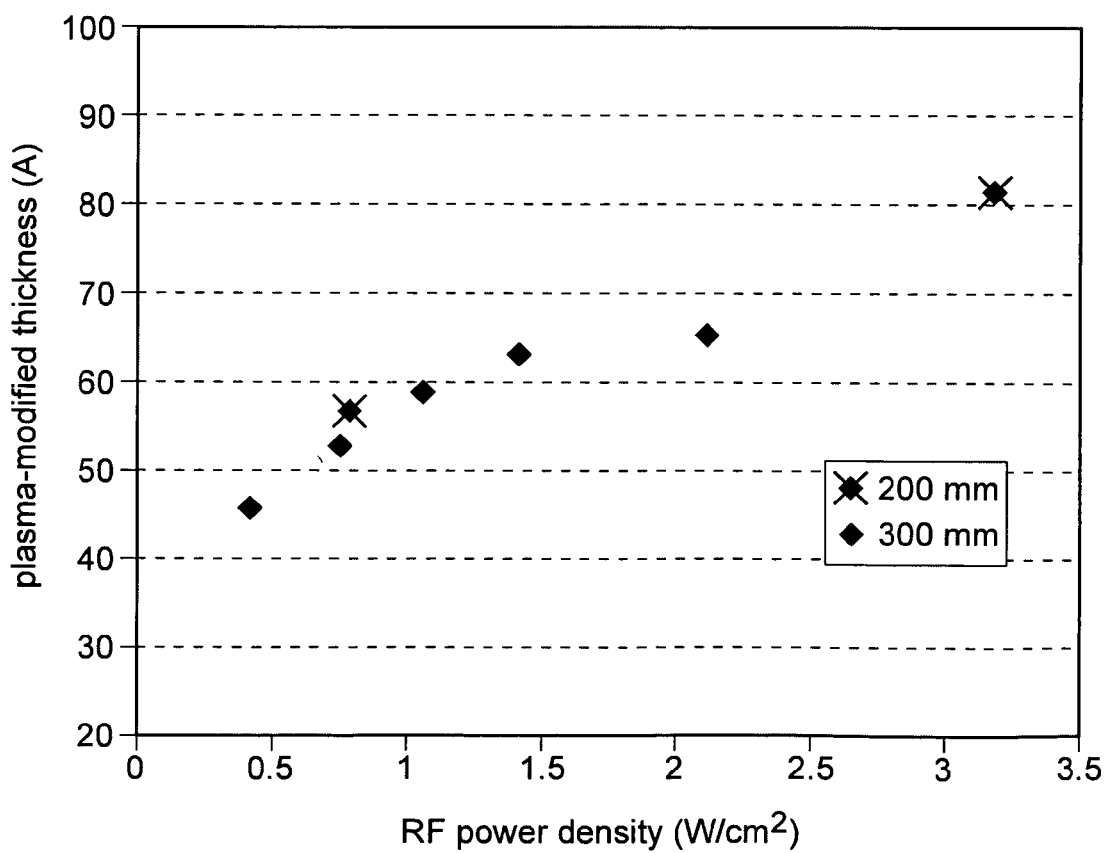
FIG. 2 is a graph illustrating the influence of the power applied for generating the plasma used to activate the surface of a wafer of semiconductor material (in this case surface-oxidized Si) over the thickness of the disturbed zone that is obtained under the surface of the wafer as a result of the activation.

As mentioned above, it is possible to control activation parameters by controlling the density of the power fed to an electrode connected to the wafer whose surface to be activated. Applying greater power has the effect of increasing the thickness of the resulting disturbed region. This is illustrated in FIG. 2 in which the power density used for activating the plasma is plotted along the abscissa in $W/cm^2$, and the thickness of the disturbed region created by the activation is plotted up the ordinate in Å. Each point in the graph of this figure corresponds to a different power level. The curve was generated for wafers having a diameter of 300 mm (black diamonds) or a diameter of 200 mm (two black crosses, the cross on the left corresponding to a power of 250 W and the cross on the right corresponding to a power of 1000 W). Thus, when the surface of the wafer to be activated is a disk having a diameter of 200 mm to 300 mm, the high power has a value of 1000 W to 2000 W, and the low power has a value of 250 W to 500 W.

It is also specified that the "power" that is controlled in the context of the invention is the power of the electrode connected to the wafer to be activated, for the purpose of controlling the kinetic energy of the ionized species of the plasma. When controlling power, the power density is varied by initially applying high power, and subsequently applying low power, i.e. power at a level that is lower than the high power.

Figure 3:
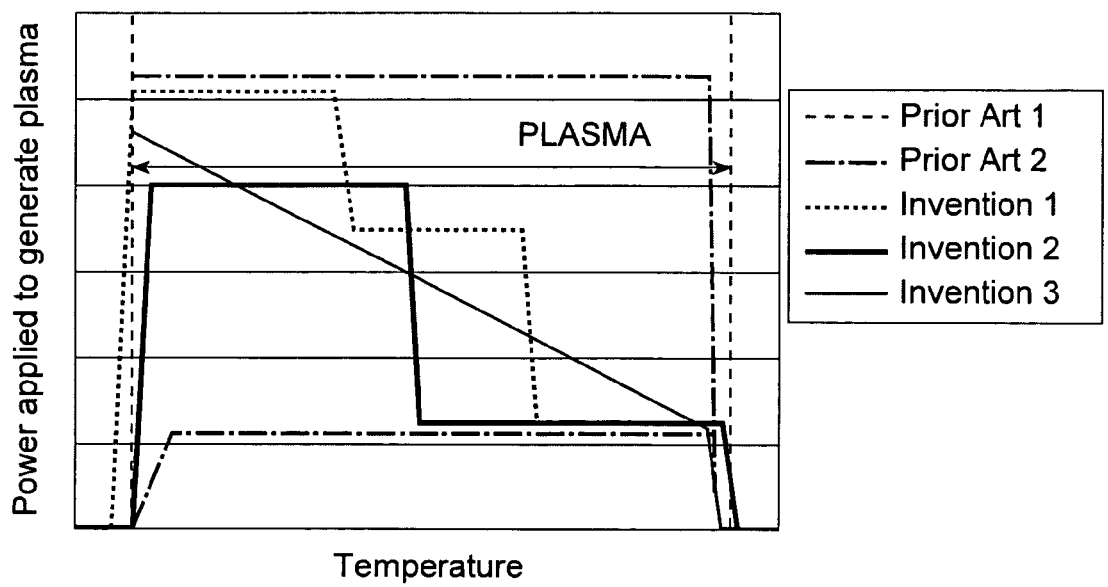
FIG. 3 is a graph showing various possible changes in the level of power applied to generate the plasma used for activating the surface of a semiconductor material wafer, plotted as a function of time. In this graph, the two curves plotted in dashed lines correspond to the prior art (power at a single unchanging value throughout the activation), and the three curves plotted in solid lines correspond to three variant implementations of the invention.

The variation between high power and low power can be performed in power steps, with one power of step corresponding to high power and another power step corresponding to low power. This is illustrated by two of the three curves plotted using continuous lines in FIG. 3. In this figure, the curves drawn in dashed lines corresponding to prior art conditions, where power is kept constant throughout activation. The level corresponding to high power and the level corresponding to low power are each maintained for a duration lying in the range 5 s to 60 s, and preferably in the range 10 s to 30 s.

It is also possible to cause power to vary from high power to low power in continuous manner by causing the power to decrease from high power down to low power. This is illustrated by the curve in FIG. 3 that presents a slope that is continuous between an initial high power and a final low power. This continuous variation is typically performed over a time interval of duration lying in the range 10 s to 2 min.

The high and low power levels are defined as a function of the area of the surface to be activated. The high power level typically has a value lying in the range 1.5 $W/cm^2$ to 15 $W/cm^2$ over the surface to be activated, and the low power typically has a value lying in the range 0.15 $W/cm^2$ to 1.5 $W/cm^2$ over the surface to be activated. More precisely, it is possible to select a high power having a value of 3 $W/cm^2$ over the surface to be activated, and a low power having a value of 0.8 $W/cm^2$ over the surface to be activated.

Under such circumstances, and for a wafer to be activated having a surface in the form of a disk with a diameter of 200 mm, the high power has a value of 1000 W and the low power has a value of 250 W. For a wafer to be activated whose surface in the form of a disk having a diameter of 300 mm, the high power has a value of 2000 W and the low power has a value of 500 W.

It is also possible to control activation parameters by controlling the composition of the gas from which the plasma is created. This type of control can be implemented in combination with controlling power in a manner described above, or it may constitute the only control applied. The control of gas composition is generally implemented to obtain controlled variation in the nature of the gas used for generating the plasma. This variation consists in treating the surface to be activated with a plasma obtained from a first gas and subsequently with a plasma obtained from a second gas. The first gas is preferably made up of one or more species that is/are lighter in weight than the second gas. Specifically this makes it possible:

at the beginning of activation, to cause the species of the first gas to penetrate more deeply into the wafer to be activated; and towards the end of activation, to finish off making the disturbed region by causing second species to penetrate into the wafer to be activated, the second species being heavier and therefore penetrating to a shallower depth in the wafer to be activated.

For example, the first gas may be helium and the second gas may be oxygen or argon. In another example, the first gas may be oxygen and the second gas argon. The first and/or second gas may also be constituted by a mixture of gases—e.g. a mixture between a species that is to be ionized (e.g. Ar or $O_2$), and a species that is to remain neutral (non-ionized), but that serves to dilute and determine the quantity of the species that is ionized (which non-ionized species may be constituted by helium, for example).

It is also possible to control the activation parameters by controlling the pressure in the plasma. Here again, this control may be performed on its own, or in combination with at least one of the above-described controls (power, composition). Pressure can be controlled so as to be lower at the beginning of activation and higher towards the end of activation.

In general, it is desired to obtain activation at higher kinetic energy at the beginning of activation and activation at lower kinetic energy subsequently. A lower pressure leads to a higher level of kinetic energy. Typical pressure values lie in the range 5 millitorr (mTorr) to 10 Torr, and preferably in the range 20 mTorr to 100 mTorr.

Under all circumstances, the activation parameters are controlled for the purpose of creating a disturbed region in the thickness of the surface region of the wafer whose surface has been activated. This disturbed region is preferably a region that is uniform and continuous with increasing depth in the wafer. Nevertheless, and alternatively, it is possible by means of the invention to create a plurality of disturbed regions in the thickness of the surface region of the wafer whose surface has been activated, with each of these disturbed regions extending over a respective depth in the thickness of the wafer and having a respective thickness.

Figure 4:
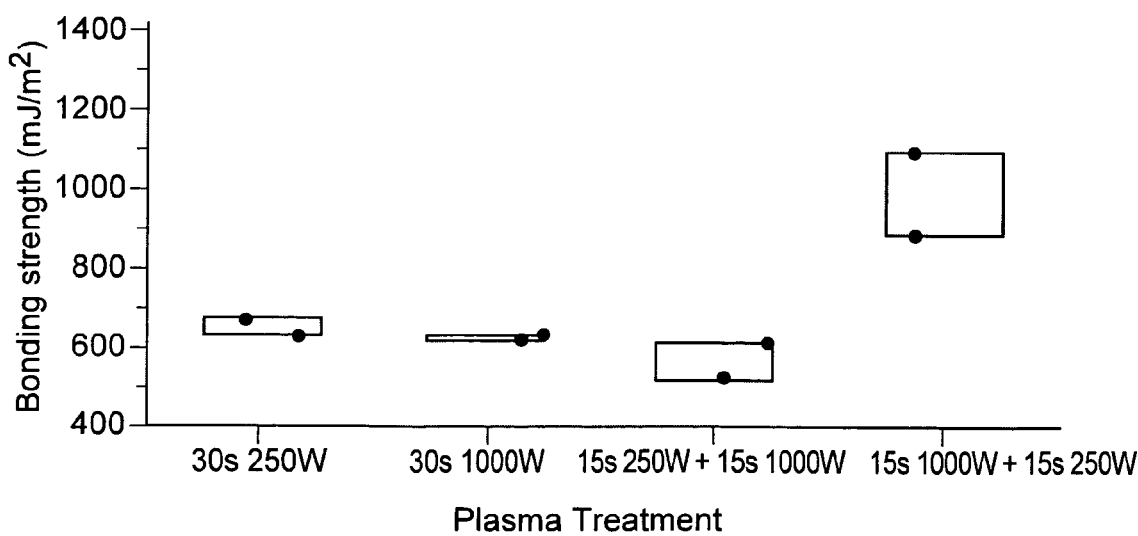
FIG. 4 is a graph illustrating the bonding energy obtained between an Si wafer and a surface-oxidized Si wafer that has been plasma-activated prior to bonding, for four different activation conditions.

The invention makes it possible significantly to increase the bonding energy obtained after bonding together surfaces, at least one of which has been activated in accordance with the invention. In this respect, FIG. 4 shows the bonding energy (in $mJ/m^2$) obtained for four different activations, all performed on only one of the surfaces to be bonded together—specifically the surface of an Si wafer that was surface oxidized and that was subsequently implanted for the purpose of transferring a thin layer by a method of the SMART-CUT® type. The other surface (which was that of an Si wafer) was not activated in the examples shown in this figure.

This FIG. 4 shows more particularly the effect of appropriately selecting variation in activation power on the bonding energy that is obtained (the other activation parameters remaining the same for all four activations). The dashed line in the bottom portion of the graph in this figure represents the level of bonding energy that would be obtained without activation. Each respective activation is represented by the mean of a plurality of measurement points. From left to right in the figure the four activations shown correspond to the following sets of power conditions:

a constant value of power (250 W for 30 s);
a constant value of power (1000 W for 30 s);
varying power comprising 250 W for 15 s followed by 1000 W for 15 s;
varying power comprising 1000 W for 15 s followed by 250 W for 15 s.

A significant increase in bonding energy is observed in the fourth set of conditions. This figure thus shows that controlling the power can lead to a very significant increase in the bonding energy. It also shows that this increase is obtained by implementing high power initially followed by low power subsequently.

It is desirable to prepare the portion of the disturbed region that is buried the most deeply before preparing the shallower portion of the region. Controlling activation parameters continuously (in this case controlling power continuously), serves to create a disturbed region in continuous manner of depth and thickness that are well controlled, while ensuring that the disturbed region is uniform.

This increase in bonding energy makes it possible in particular to activate only one of the surfaces that are to be bonded together, which constitutes an advantage. The fact of activating only one of the surfaces for bonding corresponds to a saving in time. This also makes it possible to restrict the contamination in metals and particles that is the result of exposure to the plasma to a single surface only, and thus to:

reduce the overall level of such contamination; and
limit the cleaning operations that might be necessary between activation and bonding to a single surface.

Furthermore, it is possible to envisage bonding together two surfaces, one of which is incapable of withstanding plasma activation, while nevertheless obtaining good bonding energy. For example, it is possible to bond a substrate covered in a fragile material with a wafer (e.g. having a surface of Si or of $SiO_2$), by activating the wafer only.

EXAMPLE

By way of non-limiting example and in addition to the values set out above, it is possible to implement activation and bonding of an Si wafer with another Si wafer that is surface oxidized by performing the following sequence:

preparing the two surfaces for bonding together (wet cleaning of the RCA (Radio Corporation of America) type, etc., polishing, . . . );

plasma activation of one or both of the surfaces for bonding together by "double power" treatment: a "Toyko Electron Limited" (registered trademark) plasma machine can be used for wafers having a diameter of 200 mm, using a pressure of 50 mTorr under an atmosphere of $O_2$, with an $O_2$ flow rate of 75 standard cubic centimeters per minute (sccm), and a power of 1000 W for 15 s and then 250 W for the following 15 s;

optional cleaning of the surfaces immediately prior to bonding (rinsing in deionized water, RCA type or $NH_4OH$ type cleaning, scrubbing with water, . . . ;

putting the surfaces for bonding together into contact and initiating bonding; and reinforcing the bonding by heat treatment (at low temperature, e.g. 200° C.).

As stated, the invention can be implemented in the context of a transfer method—e.g. a method of the SMART-CUT® type, for making multilayer wafers (in particular of the silicon-on-insulator (SOI) type).

What is claimed is:

1. A method of bonding together two wafers made of semiconductor materials, which comprises providing two wafers each having a surface that is suitable for molecular bonding; and conducting plasma activation of at least one surface of one of the wafers by directing plasma species onto the surface(s) being activated while controlling activation parameters of the plasma to provide kinetic energy to the species sufficient to create a disturbed region of controlled thickness beneath the surface(s) being activated.

2. The method of claim 1, wherein the surface of each wafer is activated.

3. The method of claim 1, wherein the controlling of the activation parameters obtains both the activation of the surface(s) and the creation of the disturbed region in the thickness of the activated surface(s) and also serves to control the maximum depth of the disturbed region in the surfaces.

4. The method of claim 3, wherein the disturbed region extends in the thickness of the wafer(s) whose surface is being activated between a depth of 10 Å and a depth of 250 Å.

5. The method of claim 1, wherein the kinetic energy provided for the species contained in the plasma is at a level of 10 eV to 2 keV.

6. The method of claim 1, wherein the controlling of the activation parameters comprises controlling kinetic energy by controlling the power density for generating the plasma wherein the power density is fed to an electrode connected to the wafer surface(s).

7. The method of claim 6, wherein the power density is controlled to vary by initially applying a high power, and subsequently applying a low power that is lower than the high power.

8. The method of claim 7, wherein the variation between high and low power is performed in steps, with one power step corresponding to high power, and another power step corresponding to low power, wherein each is carried out for a duration of between 5 s to 60 s.

9. The method of claim 7, wherein the variation between high power and low power is performed by causing the power to decrease in continuous manner from the high power down to the low power, wherein the high power has a value lying in the range 1.5 W/cm$^2$ to 15 W/cm$^2$, and the low power has a value lying in the range 0.15 W/cm2 to 1.5 W/cm$^2$.

10. The method of claim 9, wherein the surface of the wafer to be activated is a disk having a diameter of 200 mm to 300 mm, the high power has a value of 1000 W to 2000W, and the low power has a value of 250 W to 500W.

11. The method of claim 10, wherein the variation is performed over a time interval of duration lying in the range 10 s to 2 mn.

12. The method of claim 6, wherein the plasma is generated by equipment of the RIE type having a single RF generator feeding the electrode supporting the wafer to be activated via capacitive coupling.

13. The method of claim 6, wherein the electrode connected to the wafer whose surface is to be activated is used solely for controlling the kinetic energy of the plasma species.

14. The method of claim 6, wherein the electrode connected to the wafer whose surface is to be activated is used both for controlling the kinetic energy of the plasma species, and for exciting the plasma.

15. The method of claim 1, wherein the controlling of the activation parameters comprises controlling the composition of the gas in which the plasma is created to provide a desired kinetic energy.

16. The method of claim 15, wherein the composition of the gas is controlled by initially treating the surface(s) to be activated with a plasma obtained from a first gas, and subsequently treating such surface(s) with a plasma obtained from a second gas.

17. The method of claim 16, wherein each gas is made up of one or more species with the species of the first gas being lighter in weight than that of the second gas.

18. The method of claim 17, wherein the first gas comprises helium and the second gas comprises oxygen or argon, or the first gas comprises oxygen and the second gas comprises argon.

19. The method of claim 17, wherein the first or second gas is a gas mixture containing a species that is to be ionized and a species that is to remain neutral or non-ionized that serves to dilute the ionized species.

20. The method of claim 1, wherein the controlling of the activation parameters comprises controlling pressure in the plasma to provide a desired kinetic energy.

21. The method of claim 20, wherein the controlling of pressure comprises controlling the pressure to occupy a low level initially during activation, and then subsequently controlling the pressure to occupy a high level that is greater than the low level.

22. The method of claim 1, wherein the controlling of the activation parameters is implemented in order to create a single disturbed region in the thickness of the surface region of the wafer(s) whose surface is being activated.

23. The method of claim 1, wherein the controlling of the activation parameters is implemented in order to create a plurality of disturbed regions in the thickness of the surface region of the wafer(s) whose surface is being activated, with each disturbed region extending over a respective depth in the thickness of the wafer(s).

24. A method of transferring a thin layer of semiconductor material from a top wafer forming a donor substrate to a base wafer forming a receiver substrate, the method implementing bonding according to claim 1 in order to bond a surface of the donor substrate to a surface of the receiver substrate prior to transferring the thin layer.

25. The method of claim 24, which further comprises implanting atomic species in the top wafer prior to bonding to create a zone of weakness in the donor substrate beneath the thin layer to be transferred, followed by detachment of the thin layer at the zone of weakness after bonding the wafers together.

26. In a method of bonding together two wafers made of semiconductor materials, wherein the wafers are each provided with a surface that is suitable for molecular bonding; the improvement which comprises forming a disturbed region of controlled thickness beneath the surface of at least one of the wafers while conducting plasma activation of that surface by controlling activation parameters of the plasma to provide kinetic energy to the plasma species sufficient to both activate the surface(s) and create the disturbed region.

* * * * *

UNITED STATES PATENT AND TRADEMARK OFFICE
CERTIFICATE OF CORRECTION

PATENT NO. : 7,419,884 B2
APPLICATION NO. : 11/285009
DATED : September 2, 2008
INVENTOR(S) : Kerdiles It is certified that error appears in the above-identified patent and that said Letters Patent is hereby corrected as shown below:

Column 11:
Line 38 (claim 9, line 6), after "0.15" change "W/cm2" to -- $W/cm^2$ --.
Line 45 (claim 11, line 3), change "mm" to -- min --.

Signed and Sealed this

Twenty-eighth Day of October, 2008

JON W. DUDAS
*Director of the United States Patent and Trademark Office*